(12) United States Patent
Kim et al.

(10) Patent No.: US 12,402,410 B2
(45) Date of Patent: Aug. 26, 2025

(54) METHOD OF PROVIDING DISPLAY DEVICE AND DISPLAY DEVICE PROVIDED THEREBY

(71) Applicant: Samsung Display Co., LTD., Yongin-si (KR)

(72) Inventors: Heena Kim, Seoul (KR); Sangjin Park, Yongin-si (KR); Inkyung Yoo, Hwaseong-si (KR); Sang Jin Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 432 days.

(21) Appl. No.: 18/075,766

(22) Filed: Dec. 6, 2022

(65) Prior Publication Data

US 2023/0253523 A1 Aug. 10, 2023

(30) Foreign Application Priority Data

Feb. 7, 2022 (KR) .................. 10-2022-0015654

(51) Int. Cl.
| | |
|---|---|
| *H10D 86/01* | (2025.01) |
| *H10D 30/01* | (2025.01) |
| *H10H 20/01* | (2025.01) |
| *H10D 86/60* | (2025.01) |

(52) U.S. Cl.
CPC ..... *H10D 86/0223* (2025.01); *H10D 30/0321* (2025.01); *H10H 20/01* (2025.01); *H10D 30/0314* (2025.01); *H10D 86/60* (2025.01); *H10H 20/032* (2025.01); *H10H 20/0364* (2025.01)

(58) Field of Classification Search
CPC .................................. H10D 86/0223
See application file for complete search history.

(56) References Cited

U.S. PATENT DOCUMENTS

2018/0331206 A1* 11/2018 Min .................. H01L 21/0272

FOREIGN PATENT DOCUMENTS

KR 100701449 B1 3/2007

* cited by examiner

*Primary Examiner* — Zandra V Smith
*Assistant Examiner* — Molly K Reida
(74) *Attorney, Agent, or Firm* — CANTOR COLBURN LLP

(57) ABSTRACT

A method of providing a display device includes providing a preliminary active layer, providing a preliminary insulation layer on the preliminary active layer, providing a doped area of the preliminary active layer, the providing of the doped area including providing impurities through the preliminary insulation layer on the preliminary active layer and to a portion of the preliminary active layer corresponding to the doped area, providing removal of the preliminary insulation layer from the preliminary active layer having the doped area, and providing crystallizing of the preliminary active layer having the doped area, the providing of the crystallizing including irradiating a laser to the preliminary active layer having the doped area to define an active layer of the display device which has the doped area.

20 Claims, 16 Drawing Sheets

METHOD OF PROVIDING DISPLAY DEVICE AND DISPLAY DEVICE PROVIDED THEREBY

This application claims priority to Korean Patent Application No. 10-2022-0015654, filed on Feb. 7, 2022, and all the benefits accruing therefrom under 35 U.S.C. § 119, the content of which in its entirety is herein incorporated by reference.

BACKGROUND

(1) Field

Implementations of the invention relate generally to a display substrate and a mother substrate for providing a display substrate.

(2) Discussion of the Related Art

A display device is manufactured (or provided) and used in various ways. The display device may display an image to provide visual information to outside the display device, such as to a user. To this end, the display device may include various light emitting elements. For example, a display device may include a liquid crystal display device that emits light using a liquid crystal layer, an inorganic light emitting display device that emits light using an inorganic light emitting diode, and an organic light emitting display device that emits light using an organic light emitting diode.

The light emitting elements may emit light by receiving signals from driving elements. The driving elements may include transistor, capacitor, etc. In this case, quality of an image displayed by the display device may be determined according to performance of the driving elements.

SUMMARY

Embodiments provide a display device displaying an image.

A method of manufacturing (or providing) a display device may include forming (or providing) a buffer layer on a substrate, forming a pre-active layer (e.g., a preliminary active layer) on the buffer layer, forming a pre-insulation layer on the pre-active layer, doping a portion of the pre-active layer with impurities, removing the pre-insulation layer, and crystallizing the pre-active layer into an active layer by irradiating a laser.

According to an embodiment, the pre-insulation layer may be removed by using an etchant.

According to an embodiment, the etchant may be BOE (buffered oxide etchant).

According to an embodiment, the BOE may include hydrogen fluoride (HF) and ammonium fluoride ($NH_4F$).

According to an embodiment, the method may further include forming a gate insulation layer on the active layer, forming a gate electrode on the gate insulation layer, forming an interlayer insulation layer on the gate electrode, and forming electrodes connected to the active layer on the interlayer insulation layer.

According to an embodiment, the electrodes may be connected to an area doped with the impurities of the active layer.

According to an embodiment, the method may further include forming a via insulation layer on the electrodes, and forming a light emitting element connected to the electrodes on the via insulation layer.

According to an embodiment, the pre-insulation layer may be formed to cover the buffer layer and the pre-active layer.

According to an embodiment, the pre-active layer may include amorphous silicon, and the active layer may include polycrystalline silicon.

According to an embodiment, the laser may be an excimer laser.

According to an embodiment, the impurities may be boron.

According to an embodiment, the impurities may be fluorine.

According to an embodiment, the impurities may be phosphorus.

According to an embodiment, a thickness of the pre-insulation layer may be about 550 angstroms to about 650 angstroms.

According to an embodiment, the method may further include forming a gate insulation layer on the active layer after the crystallizing the pre-active layer into the active layer. A thickness of the gate insulation layer may be larger than the thickness of the pre-insulation layer.

According to an embodiment, the thickness of the gate insulation layer may be about 1400 angstroms to about 1600 angstroms.

According to an embodiment, the pre-insulation layer may be formed to cover the buffer layer and the pre-active layer. A thickness of the pre-insulation layer may be about 550 angstroms to about 650 angstroms.

According to an embodiment, the method may further include forming a gate insulation layer on the active layer after the crystallizing the pre-active layer into the active layer. A thickness of the gate insulation layer may be larger than the thickness of the pre-insulation layer.

According to an embodiment, the thickness of the gate insulation layer may be about 1400 angstroms to about 1600 angstroms.

According to an embodiment, the pre-insulation layer may include silicon oxide.

In the present invention, one or more embodiment of a method of manufacturing (or providing) the display device may include forming a pre-insulation layer. Accordingly, after impurities are doped to a pre-active layer by transmitting the impurities through the pre-insulation layer and to the pre-active layer, a native oxide layer may not be formed on the pre-active layer. That is, the pre-insulation layer through which the impurities are transmitted to the pre-active layer, may prevent deterioration of performance of the pre-active layer. In addition, the pre-insulation layer may be formed on the buffer layer. Accordingly, when the pre-insulation layer is removed with an etchant, flatness of the display device may be secured by removing the pre-insulation layer uniformly.

In the present invention, one or more embodiment provides a display device including a transistor including an active layer, and the active layer may include a doped area. The doped area of the active layer may include a doped portion of a preliminary active layer, the doped portion doped with an insulation layer-transmitted impurity. The display device may further include a display element which is connected to the transistor at the doped area including the doped portion which is doped with the insulation layer-transmitted impurity. The insulation layer-transmitted impurity is doped to the preliminary active layer through an insulation layer on the preliminary active layer, to prevent formation of a native oxide layer of the doped preliminary active layer. The active layer of the transistor may further include a crystallized portion of the preliminary active layer.

It is to be understood that both the foregoing general description and the following detailed description are examples and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention together with the description.

DETAILED DESCRIPTION

Figure 1:
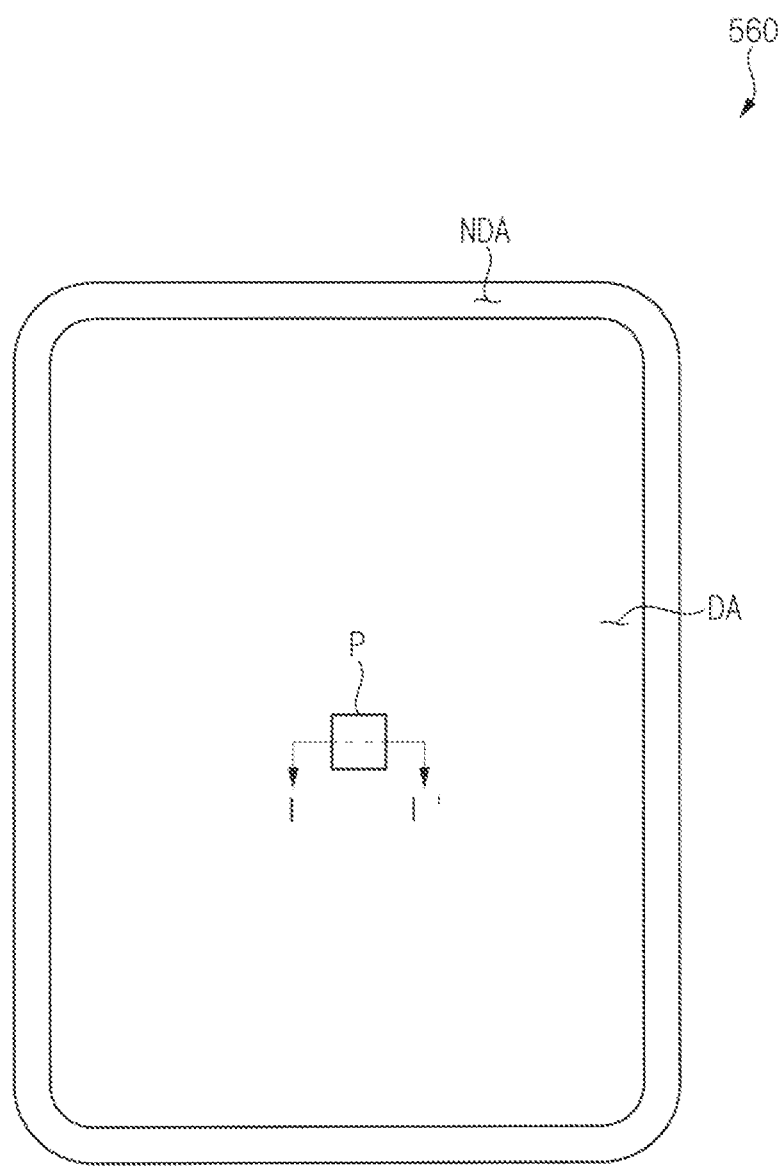
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to an element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, a reference number may indicate a singular element or a plurality of the element. For example, a reference number labeling a singular form of an element within the drawing figures may be used to reference a plurality of the singular element within the text of specification.

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Illustrative, non-limiting embodiments will be more clearly understood from the following detailed description in conjunction with the accompanying drawings.

FIG. 1 is a plan view illustrating a display device 560 according to an embodiment.

Referring to FIG. 1, a display device 560 may include a display area DA and a non-display area NDA adjacent to the display area DA. The non-display area NDA may be disposed to surround the display area DA, without being limited thereto. Various components or layers of the display device 560 may include a display area DA and a non-display area NDA corresponding to those described above. The display area DA and the non-display area NDA may be disposed in a plane defined by a first direction and a second direction which cross each other. A thickness direction of the display device 560 and various components or layers thereof may be defined along a third direction crossing each of the first direction and the second direction.

The display area DA may be defined as an area (e.g., a planar area) displaying an image or at which the image is displayed. To this end, a pixel P provided in plural including a plurality of pixels P may be disposed in the display area DA. Each of the plurality of pixels P may include a plurality of sub-pixels. For example, each of the plurality of pixels P may include a red sub-pixel emitting red light, a green sub-pixel emitting green light, and a blue sub-pixel emitting blue light. Alternatively, each of the plurality of pixels P may include a red sub-pixel emitting red light, a green sub-pixel emitting green light, a blue sub-pixel emitting blue light, and a white sub-pixel emitting white light. In addition, each of the plurality of sub-pixels P may include various sub-pixels.

Each of the plurality of pixels P may include a driving element and a light emitting element which is connected to the driving element. The light emitting element may emit light based on signals (e.g., electrical) transmitted from the driving element. In order for the display device 560 to effectively emit light, optimum performance of the driving element and performance of the light emitting element are desired.

A plurality of driving parts may be disposed in the non-display area NDA. The plurality of driving parts may be variously connected to the plurality of pixels P, and may transmit various signals to the plurality of pixels P.

Figure 2:
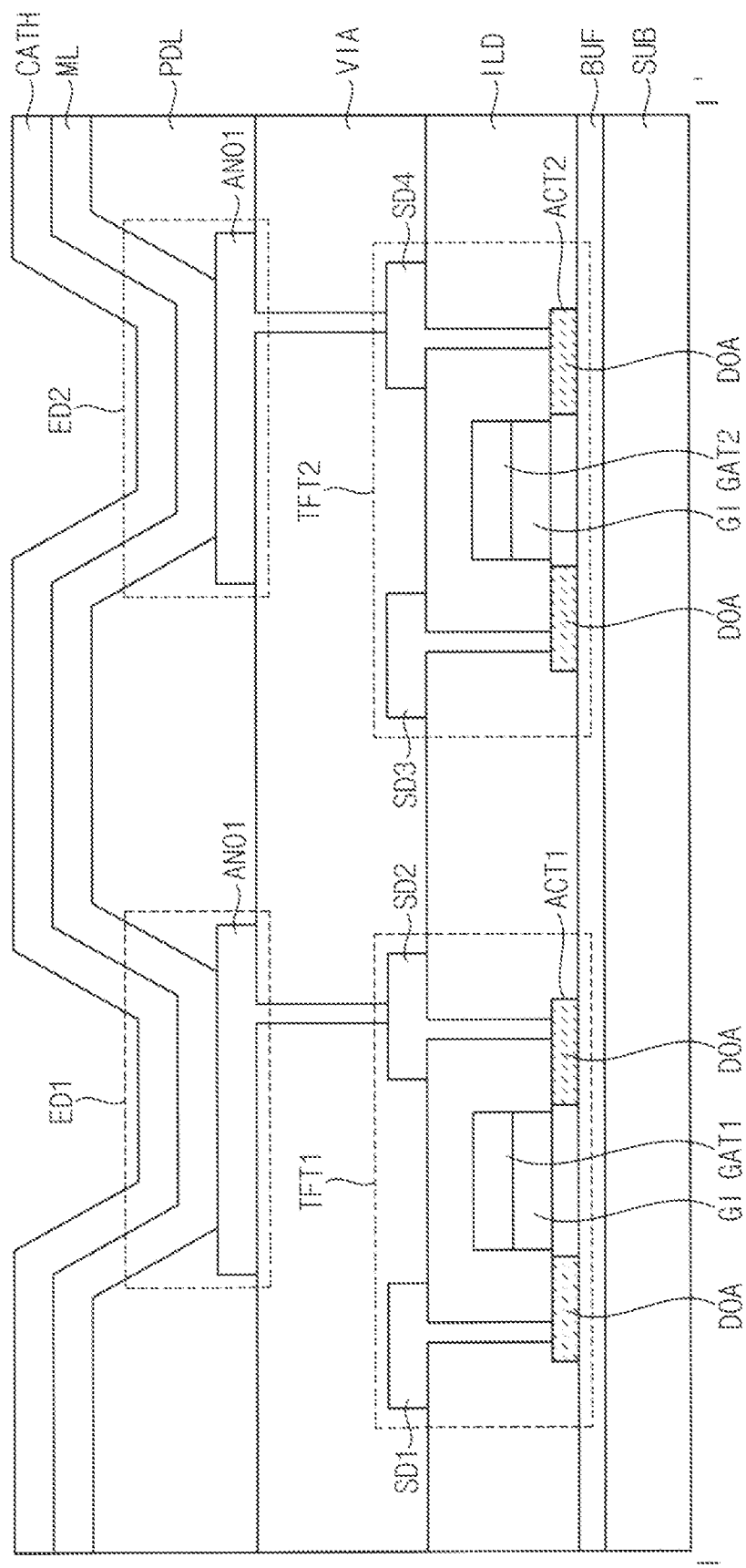
FIG. 2 is a cross-sectional view taken along line I-I' of FIG. 2.

FIG. 2 is a cross-sectional view taken along line of FIG. 2. A horizontal direction in FIG. 2 may variously represent a first direction and/or a second direction, while a vertical direction in FIG. 2 may define a thickness direction (e.g., along a third direction).

Referring to FIG. 2, the display device 560 may include a substrate SUB, a buffer layer BUF, a first transistor TFT1, a second transistor TFT2, a gate insulation layer GI, an interlayer insulation layer ILD, a via insulation layer VIA, a first light emitting element ED1, a second light emitting element ED2, and a pixel defining layer PDL.

The first transistor TFT1 may include a first active layer ACT1, a first gate electrode GAT1, a first connection electrode SD1, and a second connection electrode SD2. The second transistor TFT2 may include a second active layer ACT2, a second gate electrode GAT2, a third connection electrode SD3, and a fourth connection electrode SD4. The various transistors may be disposed in a transistor layer on the substrate SUB.

The first light emitting element ED1 may include a first anode electrode ANO1 (e.g., a first electrode), a middle layer ML (e.g., light emission layer), and a cathode electrode CATH (e.g., a second electrode). The second light emitting element ED2 may include a second anode electrode ANO2, the middle layer ML, and the cathode electrode CATH. The first light emitting element ED1 and the second light emitting element ED2 may together be in a light emitting element layer facing the transistor layer, with the via insulation layer VIA therebetween.

The substrate SUB may include flexible material or rigid material. For example, the substrate SUB may include polymer material such as polyimide, and in this case, the substrate SUB may be flexible. Alternatively, for example, the substrate SUB may include glass like material, and in this case, the substrate SUB may be rigid.

The buffer layer BUF may be disposed on the substrate SUB. The buffer layer BUF may include an inorganic insulation material. Examples of the inorganic insulation material may be silicon oxide, silicon nitride, silicon oxynitride, etc. These may be used alone or in combination with each other. The buffer layer BUF may prevent metal atoms or impurities from diffusing into the first active layer ACT1 and the second active layer ACT2. The buffer layer BUF may control a rate of heat provided to the first active layer ACT1 and the second active layer ACT2 during the crystallization process for forming (or providing) the first active layer ACT1 and the second active layer ACT2.

The first active layer ACT1 and the second active layer ACT2 may be disposed on the buffer layer BUF. In embodiments, the first active layer ACT1 and the second active layer ACT2 may include a silicon semiconductor. Examples of the silicon semiconductor may be amorphous silicon, polycrystalline silicon, etc. The first active layer ACT1 and the second active layer ACT2 may each be an active layer of a transistor within the transistor layer.

The gate insulation layer GI may be disposed on the buffer layer BUF. The gate insulation layer GI may be disposed to cover a portion of the first active layer ACT1 and a portion of the second active layer ACT2. The gate insulation layer GI may include an insulation material. Examples of the insulation material may be silicon oxide, silicon nitride, silicon oxynitride, etc. These may be used alone or in combination with each other.

The first gate electrode GAT1 and the second gate electrode GAT2 may be disposed on the gate insulation layer GI. The first gate electrode GAT1 and the second gate electrode GAT2 may overlap the first active layer ACT1 and the second active layer ACT2, respectively. In response to a gate signal as an electrical signal provided to the first gate electrode GAT1 and the second gate electrode GAT2, an electrical signal and/or a voltage may flow through the first active layer ACT1 and the second active layer ACT2. In an embodiment, the first gate electrode GAT1 and the second gate electrode GAT2 may include metal, alloy, metal oxide, transparent conductive material, etc. Examples of material used as the first gate electrode GAT1 and the second gate electrode GAT2 may be silver (Ag), alloy containing silver, molybdenum (Mo), alloy containing molybdenum, aluminum (Al), alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO)), indium zinc oxide (IZO), etc. These may be used alone or in combination with each other.

The interlayer insulation layer ILD may be disposed to cover the buffer layer BUF, the first active layer ACT1, the second active layer ACT2, the first gate electrode GAT1, and the second gate electrode GAT2. In an embodiment, the interlayer insulation layer ILD may include an insulation material. Examples of the insulation material may be silicon oxide, silicon nitride, silicon oxynitride, etc. These may be used alone or in combination with each other.

The first to fourth connection electrodes SD1, SD2, SD3, and SD4 may be disposed on the interlayer insulation layer ILD. Each of the first connection electrode SD1 and the second connection electrode SD2 may contact the first active layer ACT1 through contact holes defined in one or more layer between a respective connection electrode and a respective active layer connected thereto. Each of the third connection electrode SD3 and the fourth connection electrode SD4 may contact the second active layer ACT2 through contact holes. In an embodiment, each of the first to fourth connection electrodes SD1, SD2, SD3, and SD4 may include metal, alloy, metal oxide, transparent conductive material, etc. Examples of material used as the first to fourth connection electrodes SD1, SD2, SD3, and SD4 may be silver (Ag), alloy containing silver, molybdenum (Mo), alloy containing molybdenum, aluminum (Al), alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO)), indium zinc oxide (IZO), etc.

The via insulation layer VIA may be disposed on the interlayer insulation layer ILD. The via insulation layer VIA may be disposed to cover the first to fourth connection electrodes SD1, SD2, SD3, and SD4. The via insulation layer VIA may have substantially flat upper surface. The upper surface may be a major surface which is furthest from the transistor layer. In an embodiment, the via insulation layer VIA may include an organic insulation material. Examples of the organic insulation material may be polyacrylic resin, polyimide resin, acrylic resin, etc. These may be used alone or in combination with each other.

The first anode electrode ANO1 and the second anode electrode ANO2 may be disposed on the via insulation layer VIA. The first anode electrode ANO1 and the second anode electrode ANO2 may contact the second connection electrode SD2 and the fourth connection electrode SD4. As being in contact, elements may form an interface therebetween, without being limited thereto. In an embodiment, each of the first anode electrode ANO1 and the second anode electrode ANO2 may include metal, alloy, metal oxide, transparent conductive material, etc. Examples of material used as the first anode electrode ANO1 and the second anode electrode ANO2 may be silver (Ag), alloy containing silver, molybdenum (Mo), alloy containing molybdenum, aluminum (Al), alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO)), indium zinc oxide (IZO), etc.

The pixel defining layer PDL may be disposed on the via insulation layer VIA. One or more of an opening exposing the first anode electrode ANO1 and the second anode electrode ANO2 to outside the pixel defining layer PDL, may be formed (or defined) in the pixel defining layer PDL. In an embodiment, the pixel defining layer PDL may include an organic insulation material. Examples of the organic insulation material may be polyacrylic resin, polyimide resin, acrylic resin, etc.

The middle layer ML may be disposed on each of the first anode electrode ANO1 and the second anode electrode ANO2. The middle layer ML may include an organic material emitting light having a predetermined color (e.g., a light emission layer). The middle layer ML may emit light based on voltage different between the cathode electrode CATH, respectively with each of the first anode electrode ANO1 and the second anode electrode ANO2. To this end, the middle layer ML may include electron injection layer, electron transport layer, light emitting layer, hole transport layer, and hole injection layer.

The cathode electrode CATH may be disposed to cover the middle layer ML and the pixel defining layer PDL. The cathode electrode CATH may include metal, alloy, metal oxide, transparent conductive material, etc. Examples of material used as the cathode electrode CATH may be silver (Ag), alloy containing silver, molybdenum (Mo), alloy containing molybdenum, aluminum (Al), alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO)), indium zinc oxide (IZO), etc.

FIG. 3 to FIG. 14 are diagrams illustrating a method of manufacturing (or providing) the display device 560 of FIG. 1.

Figure 3:
FIG. 3 to FIG. 14 are diagrams illustrating a method of manufacturing (or providing) the display device of FIG. 1.
Figure 4:
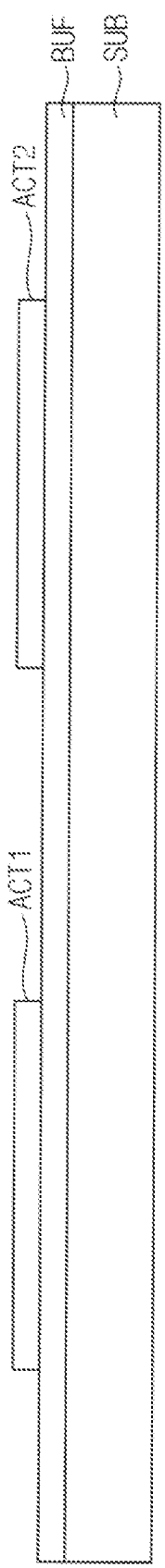

Referring to FIG. 3 and FIG. 4, the buffer layer BUF may be formed (or provided) on the substrate SUB. The buffer layer BUF may be formed to generally cover the substrate SUB. After that, the first active layer ACT1 and the second active layer ACT2 may be formed on the buffer layer BUF. Forming the first active layer ACT1 and the second active layer ACT2 may include generally forming a semiconductor material on the substrate SUB, and patterning the semiconductor material. In this case, the first active layer ACT1 and the second active layer ACT2 as a pattern of the semiconductor material layer, may be defined as a pre-semiconductor layer. The pre-semiconductor layer may include amorphous silicon. The first active layer ACT1 and the second active layer ACT2 may be in a same layer as each other. As being in a same layer, elements may be formed (or provided) in a same process and/or as include a same material, elements may be respective portions of a same material layer, may be on a same layer by forming an interface with a same underlying or overlying layer, etc., without being limited thereto. The buffer layer BUF together with the substrate SUB, may be otherwise referred to as "a substrate." The first active layer ACT1 and the second active layer ACT2 may be spaced apart from each other and expose the buffer layer BUF to outside the pre-semiconductor layer (e.g., an exposed substrate portion).

Figure 5:
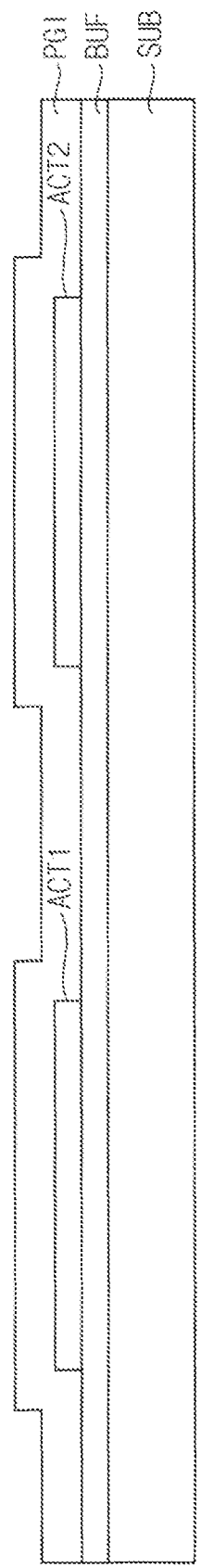

Referring to FIG. 5, a pre-insulation layer PGI (e.g., preliminary insulation layer) may be formed to cover the buffer layer BUF, the first active layer ACT1, and the second active layer ACT2. The pre-insulation layer PGI may be generally formed on the buffer layer BUF. A thickness of the pre-insulation layer PGI which is defined along the thickness direction, may be about 550 angstroms to about 650 angstroms. The pre-insulation layer PGI may include the same material as the gate insulation layer GI. The pre-insulation layer PGI may include an inorganic insulation material. Examples of the inorganic insulation material may be silicon oxide, silicon nitride, silicon oxynitride, etc. These may be used alone or in combination with each other.

Figure 6:
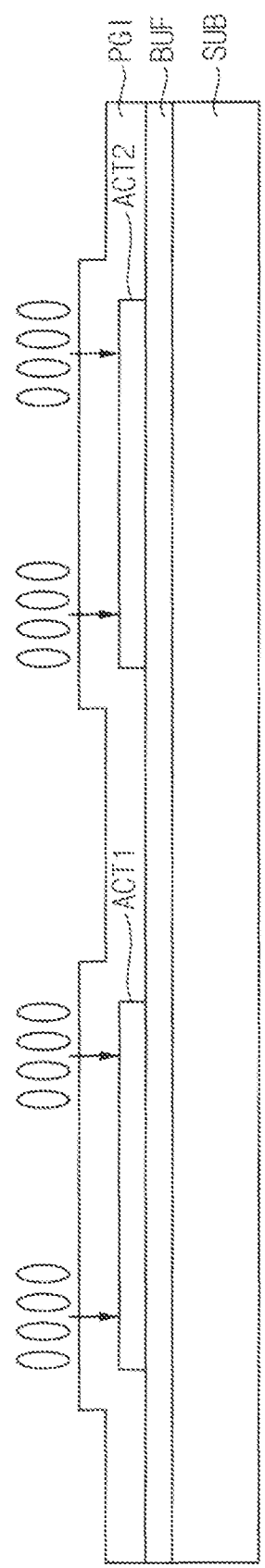

Referring to FIG. 6, impurities may be doped into the first active layer ACT1 and the second active layer ACT2. The impurities may be boron (B), fluorine (F), or phosphorus (P). Each of the active layer patterns (e.g., the first active layer ACT1 and the second active layer ACT2) may have opposing ends defined in a direction along the substrate SUB. The impurities may be doped into both sides (e.g., both of the opposing ends) of the first active layer ACT1 (refer to doped area DOA of FIG. 7) and both sides of the second active layer ACT2 (refer to doped area DOA of FIG. 7), as indicated by the ovals and arrows in FIG. 6. As shown in FIG. 6, the impurities are doped into the active layer patterns having the pre-insulation layer PGI on the active layer patterns, such that the impurities are doped to the active layer patterns through the pre-insulation layer PGI.

In this case, since the pre-insulation layer PGI is present, the impurities may be doped more deeply than the related art. Accordingly, possibility that the impurities may escape during the doping process may be reduced. In other words, since the pre-insulation layer PGI is present, the impurities are doped more deeply than the related art. Accordingly, since the impurities may be doped relatively deeply, the doped area DOA may be efficiently doped without leaking out of the impurities. However, when the thickness of the pre-insulation layer PGI is too thick, the impurities may not be effectively doped. Accordingly, as described above, the thickness of the pre-insulation layer PGI may be about 550 angstroms to about 650 angstroms.

In an embodiment, for example, a display device 560 may include a transistor including an active layer (e.g., the first transistor TFT1 and/or the second transistor TFT2), and the active layer may include a doped area DOA. The doped area DOA of the active layer includes a doped portion of a preliminary active layer (e.g., the first active layer ACT1 and the second active layer ACT2 in FIG. 7), the doped portion doped with an insulation layer-transmitted impurity (e.g., the impurity indicated by the ovals and arrows in FIG. 6 which subsequently transmits through the pre-insulation layer PGI in FIG. 6). The display device 560 may further include a light emitting element as a display element which is connected to the transistor at the doped area DOA including the doped portion which is doped with the insulation layer-transmitted impurity. The insulation layer-transmitted impurity is doped to the preliminary active layer through an insulation layer (e.g., the pre-insulation layer PGI) on the preliminary active layer. The active layer of the transistor may further include a crystallized portion of the preliminary active layer.

When the pre-insulation layer PGI is not formed, a native oxide layer may be formed on the first active layer ACT1 and the second active layer ACT2 after the impurities are doped. In this case, characteristics of the first active layer ACT1 and the second active layer ACT2 may be changed. Accordingly, performance of the first active layer ACT1 and the second active layer ACT2 may be deteriorated. Accordingly, an extra step of removing of the native oxide layer formed on the first active layer ACT1 and the second active layer ACT2 is performed.

In the method of manufacturing the display device 560 according to one or more embodiment, when the impurities are doped after the pre-insulation layer PGI is generally formed, a native oxide layer may be generally formed on the pre-insulation layer PGI. Accordingly, the method may further include removal of the native oxide layer generally formed on the pre-insulation layer PGI, from the pre-insulation layer PGI, such as by using an etchant.

Figure 7:
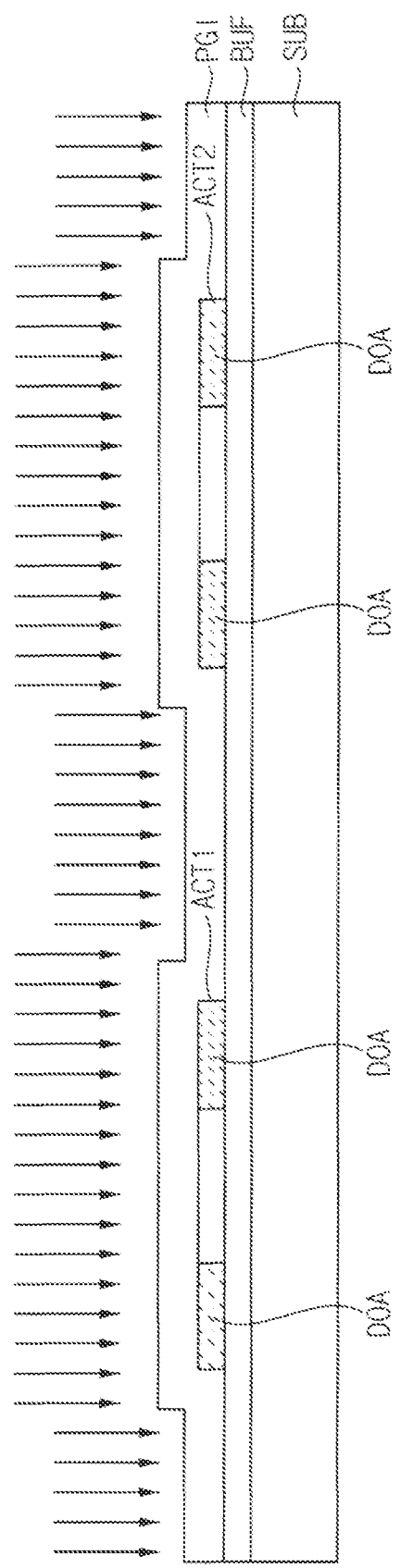
Figure 8:
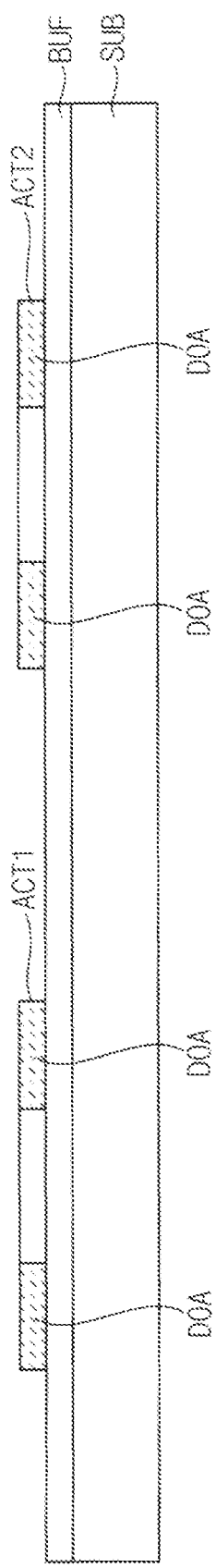

Referring to FIG. 7 and FIG. 8, the pre-insulation layer PGI may be removed. Removing of the pre-insulation layer PGI may be performed using the etchant (indicated by the downward arrows of FIG. 7). The etchant may be BOE (buffered oxide etchant). The BOE may include hydrogen fluoride (HF) and ammonium fluoride (NH$_4$F). Since the pre-insulation layer PGI is generally formed, etching may be performed uniformly by using the etchant. Accordingly, a flatness of the stacked of the display device 560 may be secured. Removal of the pre-insulation layer PGI may again expose the buffer layer BUF to outside the doped active layer patterns.

Figure 9:
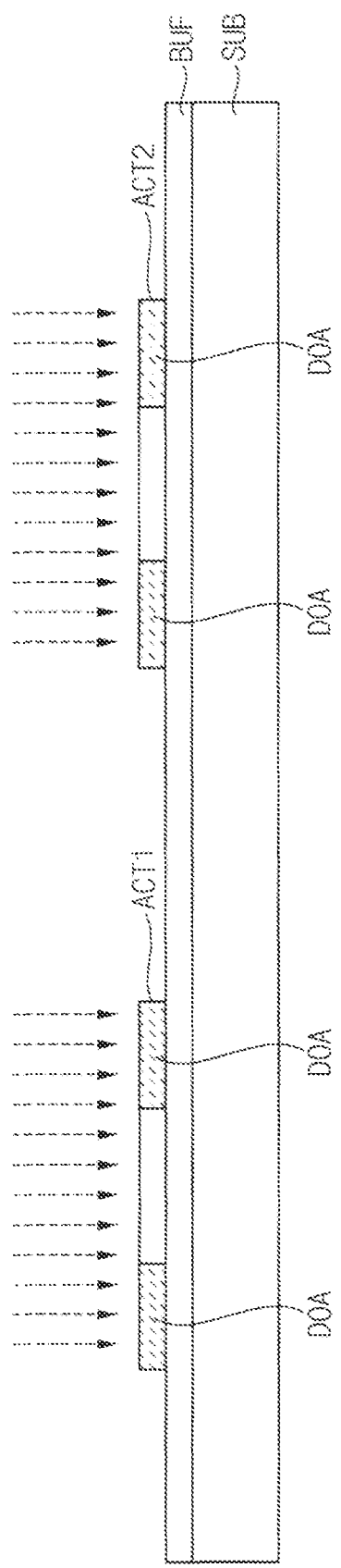

Referring to FIG. 9, laser (indicated by the dotted-line downward arrows) may be irradiated to the first active layer ACT1 and the second active layer ACT2. The laser may be an excimer laser. The first active layer ACT1 and the second active layer ACT2 as doped active layer patterns may be defined as the pre-active layer before the laser is irradiated. The pre-active layer may be defined as a semiconductor layer including amorphous silicon (e.g., pre-active semiconductor layer or preliminary active layer of a transistor). When the laser is irradiated to the pre-active layer, the amorphous silicon may be crystallized to become polycrystalline silicon. In other words, the first active layer ACT1 and the second active layer ACT2 may be crystallized to provide a semiconductor layer including polycrystalline silicon.

Figure 10:
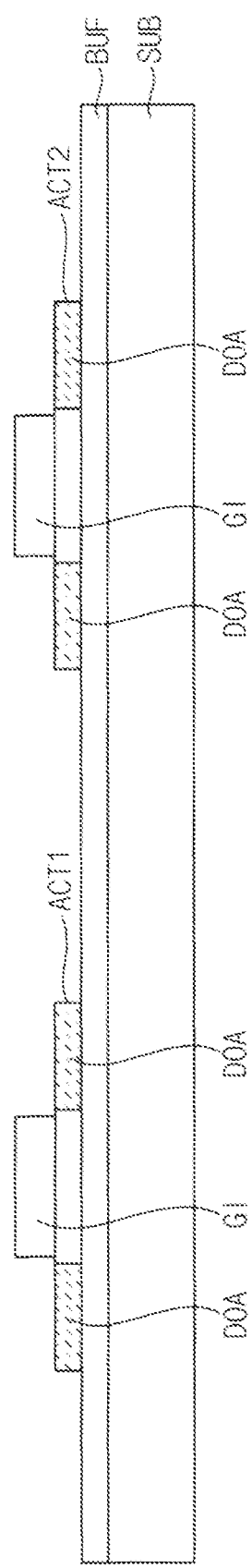

Referring to FIG. 10, the gate insulation layer GI (as a gate insulation layer pattern) may be formed on the first active layer ACT1 and the second active layer ACT2. The gate insulation layer GI may be formed to not overlap the doped area DOA. The gate insulation layer patterns may be spaced apart from each other in a direction along the substrate SUB. As not overlapping, elements may be adjacent to each other and/or spaced apart from each other along the plane.

Each of the gate insulation layer GI and the pre-insulation layer PGI may have a thickness. The thickness of the gate insulation layer GI may be larger than the thickness of the pre-insulation layer PGI. The thickness of the gate insulation layer GI may be about 1300 angstroms to about 1500 angstroms. That is, among a plurality of layers which are provided on the active layer patterns in providing the display device 560, the thickness of the gate insulation layer GI may be larger than the thickness of the pre-insulation layer PGI used for doping the underlying semiconductor material (refer to FIGS. 5 and 6).

Figure 11:
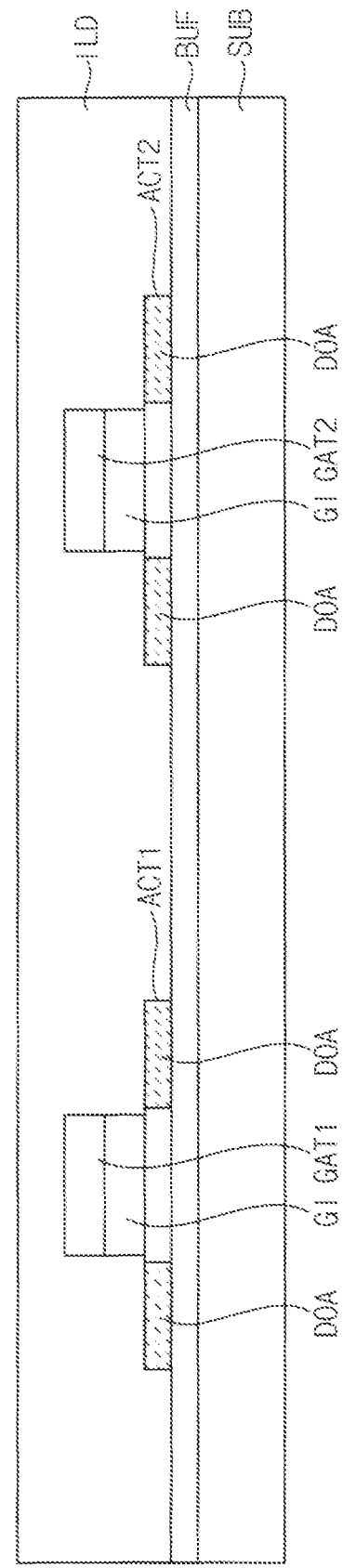

Referring to FIG. 11, the first gate electrode GAT1 and the second gate electrode GAT2 (as a gate electrode pattern) may be formed on the gate insulation layer GI. The gate electrode patterns may be spaced apart from each other. The interlayer insulation layer ILD may be formed to cover the first active layer ACT1 and the second active layer ACT2.

Figure 12:
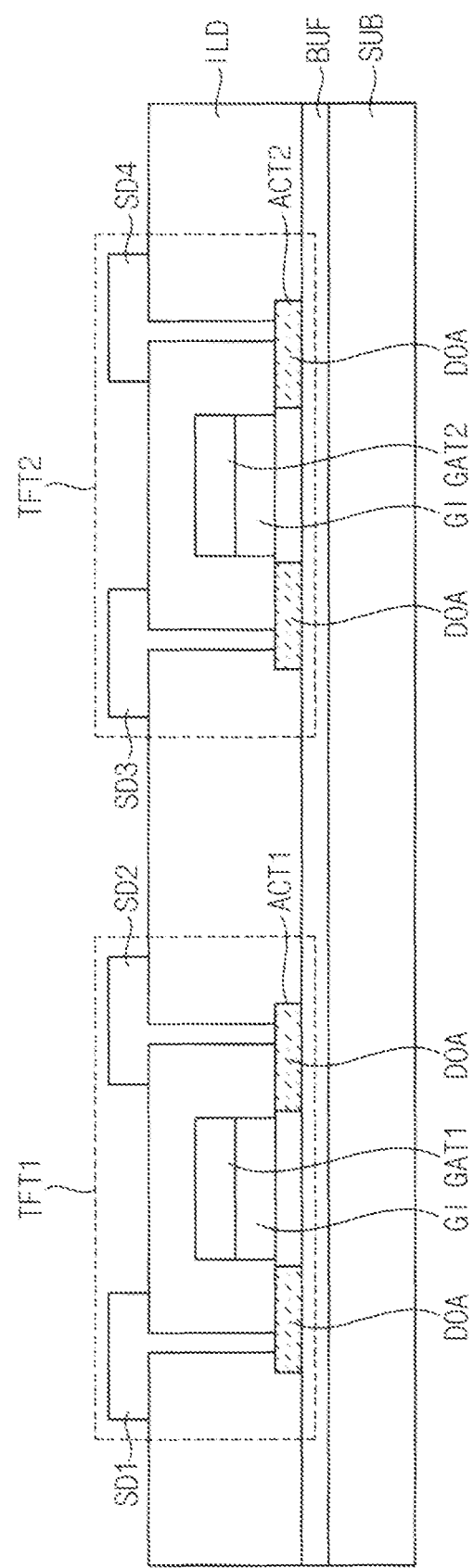

Referring to FIG. 12, the first to fourth connection electrodes SD1, SD2, SD3, and SD4 may be formed on the interlayer insulation layer ILD. The first to fourth connection electrodes SD1, SD2, SD3, and SD4 may be respectively connected to a doped area DOA among a plurality of doped areas DOA, through contact holes extended through an intermediate layer (e.g., the interlayer insulation layer ILD). A transistor layer including the first transistor TFT1 and the second transistor TFT2 may be provided on the substrate SUB.

Figure 13:
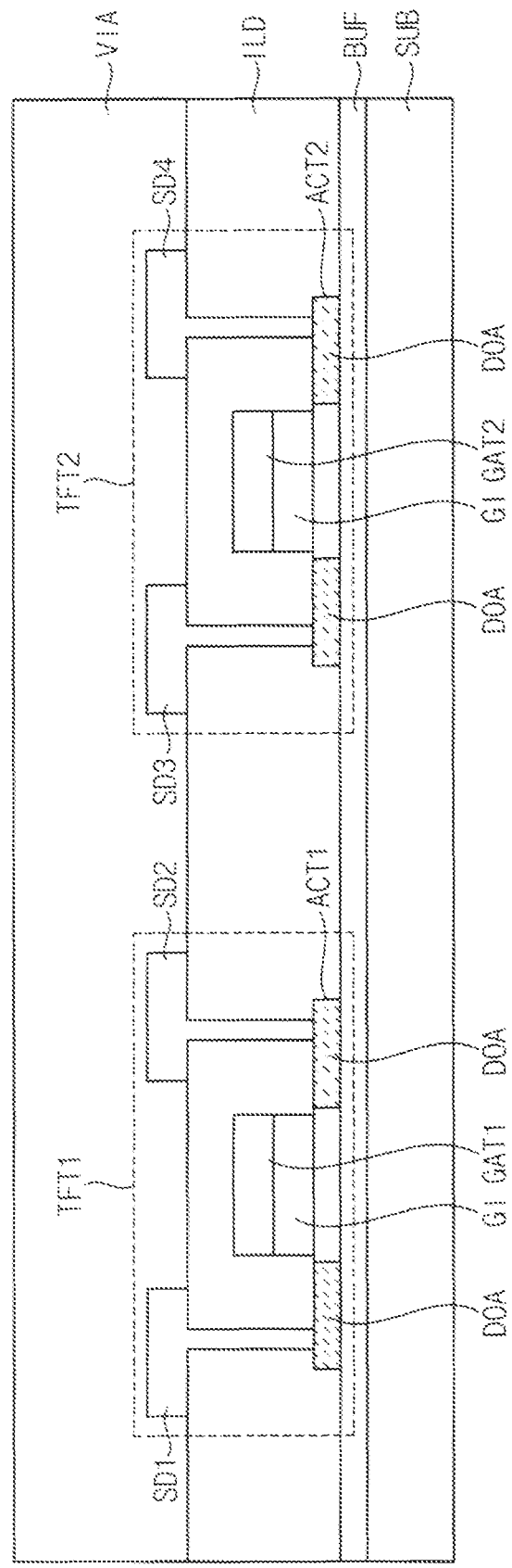

Referring to FIG. 13, the via insulation layer VIA may be disposed to cover the transistor layer including the first to fourth connection electrodes SD1, SD2, SD3, and SD4 on the interlayer insulation layer ILD.

Figure 14:
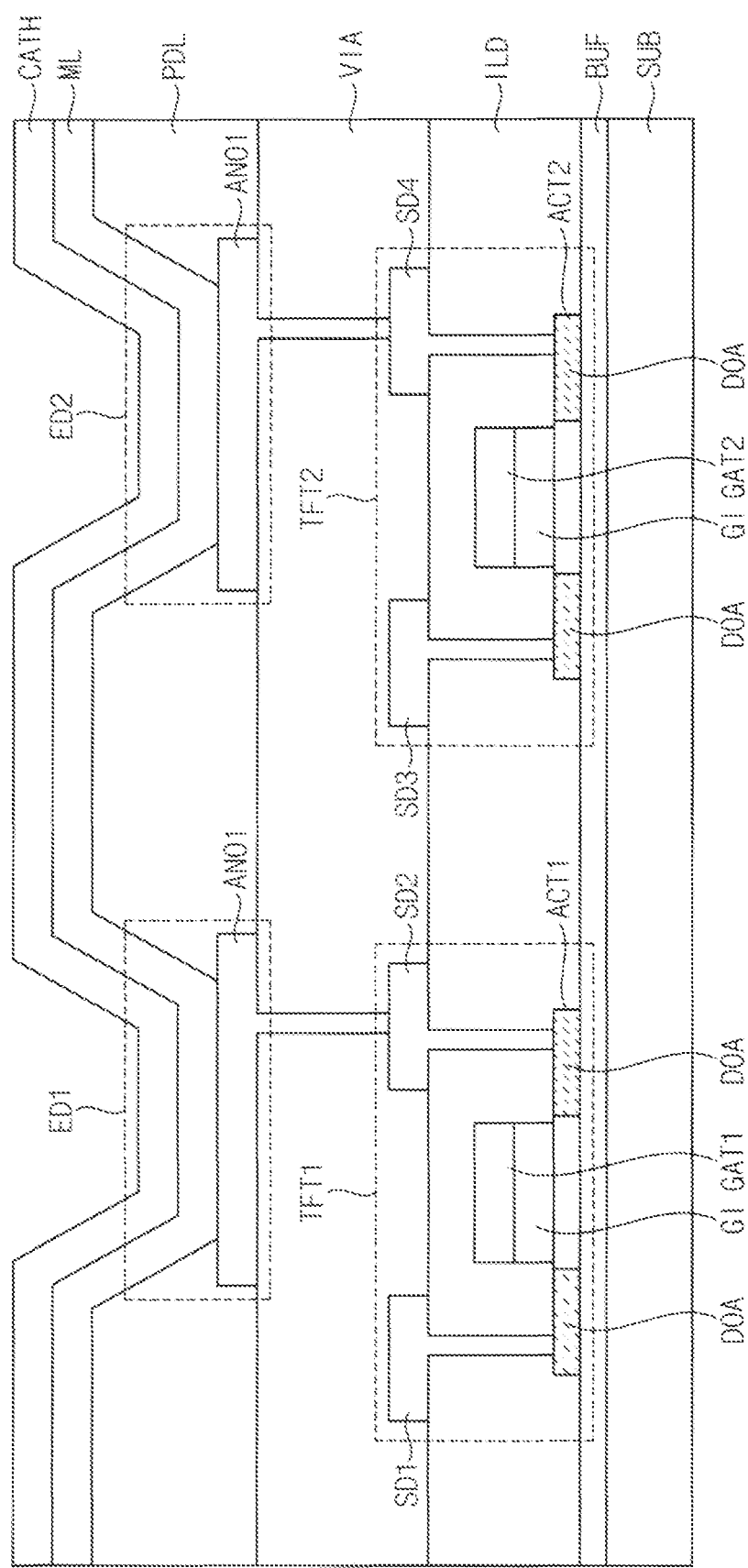

Referring to FIG. 14, the first light emitting element ED1 and the second light emitting element ED2 may be formed by providing the first anode electrode ANO1, the second anode electrode ANO2, the middle layer ML and the cathode electrode CATH. The first light emitting element ED1 and the second light emitting element ED2 may be respectively connected to the first transistor TFT1 and the second transistor TFT2 through contact holes penetrating the via insulation layer VIA.

Figure 15:
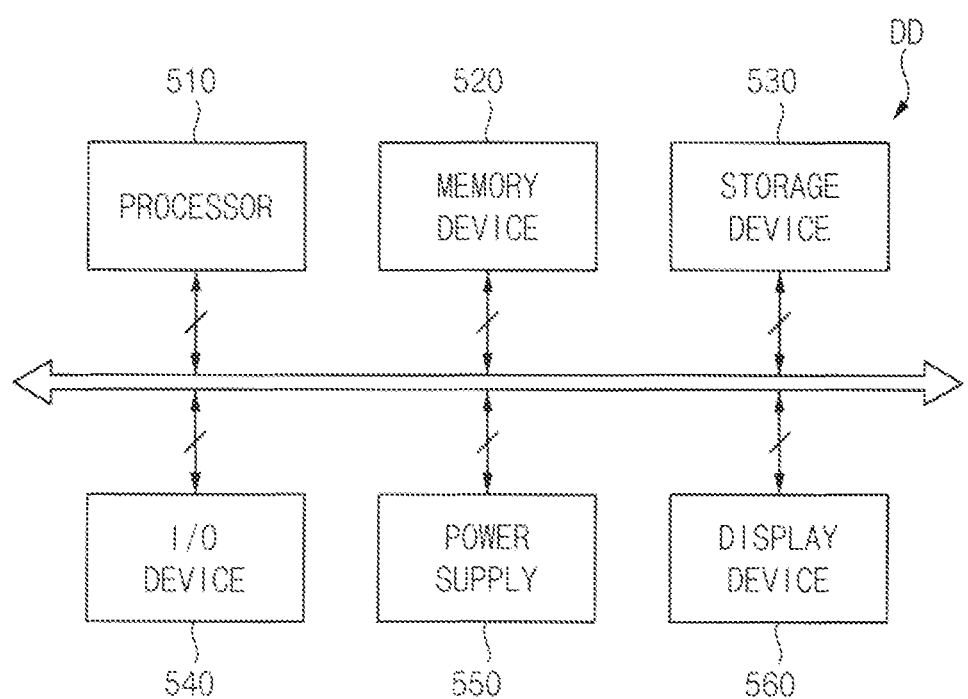
FIG. 15 is a block diagram illustrating an electronic device according to embodiments.
Figure 16:
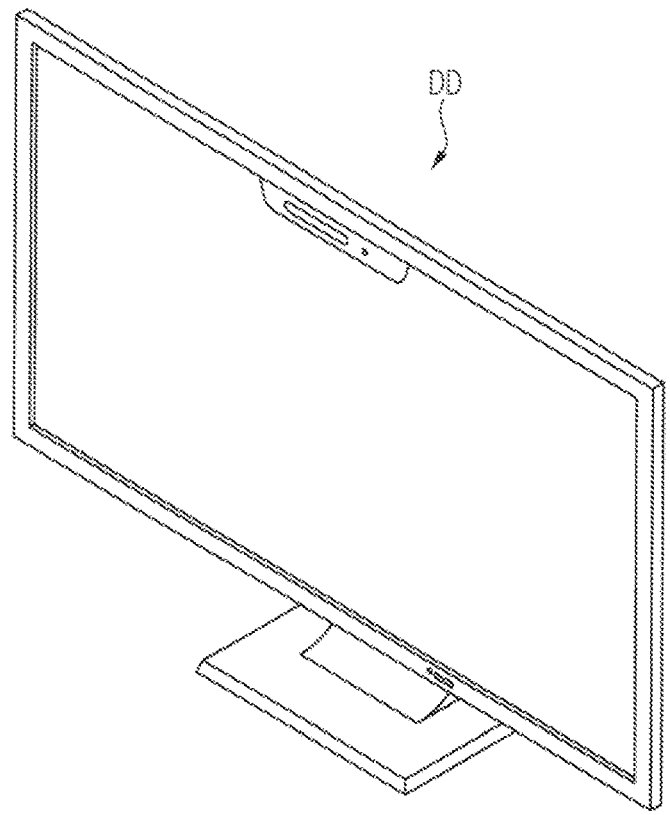
FIG. 16 is a diagram illustrating an embodiment in which the electronic device of FIG. 15 is implemented as a computer monitor.
Figure 17:
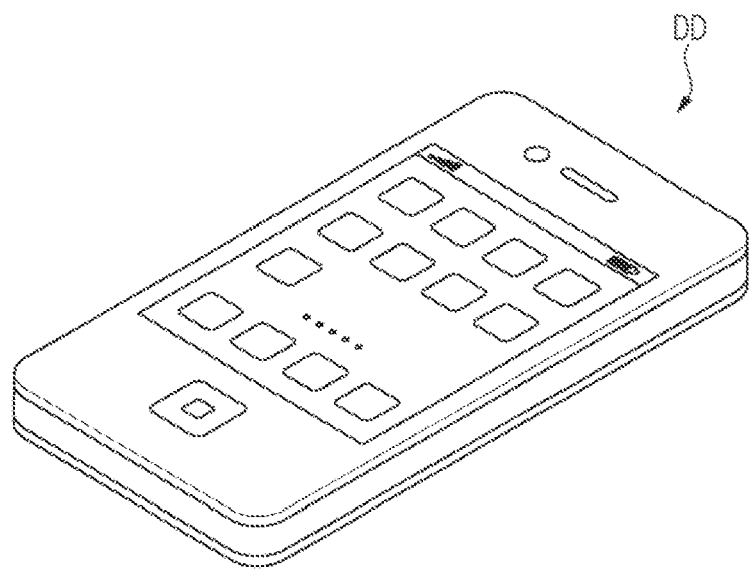
FIG. 17 is a diagram illustrating an embodiment in which the electronic device of FIG. 15 is implemented as a smartphone.

FIG. 15 is a block diagram illustrating an electronic device DD according to embodiments. FIG. 16 is a diagram illustrating an embodiment in which the electronic device DD of FIG. 15 is implemented as a computer monitor. FIG. 17 is a diagram illustrating an embodiment in which the electronic device DD of FIG. 15 is implemented as a smartphone.

Referring to FIG. 15 to FIG. 17, an embodiment of an electronic device DD may include a processor 510, a memory device 520, a storage device 530, an input/output device 540, a power supply 550, and a display device 560. In such an embodiment, the display device 560 may correspond to one or more embodiment of the display device 560 described above with reference to the above drawings. The electronic device DD may further include several ports capable of communicating with a video card, a sound card, a memory card, a USB device, and the like. In an embodiment, as illustrated in FIG. 16, the electronic device DD may be implemented as a display monitor, such as a computer monitor. In an alternative embodiment, as illustrated in FIG. 17, the electronic device DD may be implemented as such as a smartphone. However, the electronic device DD is not limited thereto, and for example, the electronic device DD includes a mobile phone, a video phone, a smart pad, a smart watch, a tablet personal computer (PC), a vehicle navigation system, a notebook computer, head mounted display ("HMD"), or the like.

The processor 510 may perform specific calculations or tasks. In an embodiment, the processor 510 may be a micro processor, a central processing unit ("CPU"), an application processor ("AP"), or the like. The processor 510 may be connected to other components through an address bus, a control bus, a data bus, or the like. In an embodiment, the processor 510 may also be connected to an expansion bus such as a peripheral component interconnect ("PCI") bus.

The memory device 520 may store data used for the operation of the electronic device DD. In one embodiment, for example, the memory device 520 may include nonvolatile memory device such as an erasable programmable read-only memory ("EPROM") device, an electrically erasable programmable read-only memory ("EEPROM") device, a flash memory device, and a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, and/or volatile memory device such as a dynamic random access memory ("DRAM") device, a static random access memory ("SRAM") device, a mobile DRAM device.

The storage device 530 may include a solid state drive ("SSD"), a hard disk drive ("HDD"), a CD-ROM, or the like. The input/output device 540 may include an input means such as a keyboard, a keypad, a touch pad, a touch screen, and a mouse, and an output means such as a speaker and a printer.

The power supply 550 may supply power for the operation of the electronic device DD. The display device 560 may be coupled to other components via buses or other communication links. According to an embodiment, the display device 560 may be included in the input/output device 540.

Although embodiments and implementations have been described herein, other embodiments and modifications will be apparent from this description. Accordingly, the embodiments are not limited to such embodiments, but rather to the broader scope of the appended claims and various obvious modifications and equivalent arrangements as would be apparent to a person of ordinary skill in the art.

What is claimed is:

1. A method of providing a display device, comprising:
providing a preliminary active layer;
providing a preliminary insulation layer on the preliminary active layer;
providing a doped area of the preliminary active layer, the providing of the doped area including providing impurities through the preliminary insulation layer on the preliminary active layer and to a portion of the preliminary active layer corresponding to the doped area;
providing removal of the preliminary insulation layer from the preliminary active layer having the doped area; and
providing crystallizing of the preliminary active layer having the doped area, the providing of the crystallizing including irradiating a laser to the preliminary active layer having the doped area to define an active layer of the display device which has the doped area.

2. The method of claim 1, wherein the providing of the removal of the preliminary insulation layer includes providing of an etchant to the preliminary insulation layer on the preliminary active layer having the doped area.

3. The method of claim 2, wherein the etchant comprises buffered oxide etchant.

4. The method of claim 3, wherein the buffered oxide etchant comprises hydrogen fluoride and ammonium fluoride.

5. The method of claim 1, further comprising:
providing a gate insulation layer, on the active layer having the doped area;
providing a gate electrode on the gate insulation layer;
providing an interlayer insulation layer, on the gate electrode;
providing electrodes which are connected to the active layer having the doped area, on the interlayer insulation layer; and
providing a transistor of the display device including the active layer having the doped area, the gate electrode and the electrodes which are connected to the active layer having the doped area.

6. The method of claim 5, wherein the electrodes are connected to the doped area of the active layer.

7. The method of claim 5, further comprising:
providing a via insulation layer on the electrodes; and
providing a light emitting element of the display device which is connected to the electrodes, on the via insulation layer.

8. The method of claim 1, wherein
the providing of the preliminary active layer includes providing the preliminary active layer on a substrate to expose a portion of the substrate to outside the preliminary active layer and define an exposed substrate portion, and
the providing of the preliminary insulation layer includes covering the preliminary active layer and the exposed substrate portion.

9. The method of claim 1, wherein
the preliminary active layer comprises amorphous silicon, and
the active layer comprises polycrystalline silicon.

10. The method of claim 1, wherein the laser comprises an excimer laser.

11. The method of claim 1, wherein the impurities comprise boron.

12. The method of claim 1, wherein the impurities comprise fluorine.

13. The method of claim 1, wherein the impurities comprise phosphorus.

14. The method of claim 1, a thickness of the preliminary insulation layer which is provided on the preliminary active layer is about 550 angstroms to about 650 angstroms.

15. The method of claim 14, further comprising:
providing a gate insulation layer on the active layer having the doped area,
wherein a thickness of the gate insulation layer which is provided on the active layer is larger than the thickness of the preliminary insulation layer which is provided on the preliminary active layer.

16. The method of claim 15, wherein the thickness of the gate insulation layer which is provided on the active layer is about 1400 angstroms to about 1600 angstroms.

17. The method of claim 1, wherein
the providing of the preliminary insulation layer comprises covering the preliminary active layer with a thickness of the preliminary insulation layer, and
the thickness of the preliminary insulation layer which covers the preliminary active layer about 550 angstroms to about 650 angstroms.

18. The method of claim 17, further comprising:
providing a gate insulation layer on the active layer having the doped area,
wherein a thickness of the gate insulation layer which is provided on the active layer is larger than the thickness of the preliminary insulation layer which covers the preliminary active layer.

19. The method of claim 18, wherein the thickness of the gate insulation layer which is provided on the active layer is about 1400 angstroms to about 1600 angstroms.

20. The method of claim 1, wherein the preliminary insulation layer through which the impurities are provided to the portion of the preliminary active layer comprises silicon oxide.

* * * * *